United States Patent
Um et al.

(10) Patent No.: US 12,519,082 B2
(45) Date of Patent: Jan. 6, 2026

(54) METHOD OF MANUFACTURING A SEMICONDUCTOR PACKAGE AND SEMICONDUCTOR PACKAGE MANUFACTURED BY THE SAME

(71) Applicant: SK hynix Inc., Icheon-si (KR)

(72) Inventors: Su Ji Um, Icheon-si (KR); Min Hee Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 406 days.

(21) Appl. No.: 18/111,460

(22) Filed: Feb. 17, 2023

(65) Prior Publication Data
US 2024/0038720 A1 Feb. 1, 2024

(30) Foreign Application Priority Data
Jul. 27, 2022 (KR) .................. 10-2022-0093351

(51) Int. Cl.
*H01L 21/56* (2006.01)
*H01L 21/48* (2006.01)
(Continued)

(52) U.S. Cl.
CPC ............ *H01L 24/85* (2013.01); *H01L 21/486* (2013.01); *H01L 21/565* (2013.01); *H01L 23/3128* (2013.01); *H01L 23/49838* (2013.01); *H01L 24/16* (2013.01); *H01L 24/32* (2013.01); *H01L 24/43* (2013.01); *H01L 24/48* (2013.01); *H01L 24/73* (2013.01); *H10B 80/00* (2023.02); *H01L 2224/16225* (2013.01); *H01L 2224/32145* (2013.01); *H01L 2224/32225* (2013.01); *H01L 2224/32245* (2013.01); *H01L 2224/43985* (2013.01); *H01L 2224/48095* (2013.01); *H01L 2224/48145* (2013.01); *H01L 2224/48225* (2013.01); *H01L 2224/48471* (2013.01); *H01L 2224/48993* (2013.01);
(Continued)

(58) Field of Classification Search
None
See application file for complete search history.

(56) References Cited

U.S. PATENT DOCUMENTS 8,415,808 B2 4/2013 Liao et al.
9,716,080 B1 * 7/2017 Chuang ............ H01L 23/49838
(Continued)

FOREIGN PATENT DOCUMENTS

KR 100604840 B1 7/2006
KR 1020190094345 A 8/2019

*Primary Examiner* — Cory W Eskridge
(74) *Attorney, Agent, or Firm* — WILLIAM PARK AND ASSOCIATES LTD.

(57) ABSTRACT

A method of manufacturing a semiconductor package of stacked semiconductor chips includes forming a reverse wire bond by bonding one end of a reverse wire to a chip pad of the second-highest semiconductor chip of the stacked semiconductor chips and connecting the other end of the reverse wire to a conductive bump on a chip pad of the uppermost semiconductor chip of the stacked semiconductor chips. The method also includes molding the stacked semiconductor chips with the reverse wire bond using a mold layer. The method further includes processing the mold layer to expose the conductive bump and the other end of the reverse wire in the reverse wire bond through an upper surface of the mold layer.

11 Claims, 10 Drawing Sheets

(51) Int. Cl.
*H01L 23/00* (2006.01)
*H01L 23/31* (2006.01)
*H01L 23/498* (2006.01)
*H10B 80/00* (2023.01)

(52) U.S. Cl.
CPC ............... *H01L 2224/73215* (2013.01); *H01L 2224/73253* (2013.01); *H01L 2224/73265* (2013.01); *H01L 2224/8513* (2013.01); *H01L 2224/85986* (2013.01); *H01L 2924/1438* (2013.01)

(56) References Cited

U.S. PATENT DOCUMENTS

| | | | | |
|---|---|---|---|---|
| 10,276,545 | B1* | 4/2019 | Huang | H01L 24/92 |
| 2010/0193930 | A1* | 8/2010 | Lee | H01L 24/24 |
| | | | | 257/E23.173 |
| 2017/0186737 | A1* | 6/2017 | Fang | H01L 24/09 |
| 2017/0278821 | A1* | 9/2017 | Zhao | H01L 24/20 |
| 2019/0214370 | A1* | 7/2019 | Ding | H01L 22/32 |
| 2019/0341372 | A1* | 11/2019 | She | H01L 25/50 |

* cited by examiner

METHOD OF MANUFACTURING A SEMICONDUCTOR PACKAGE AND SEMICONDUCTOR PACKAGE MANUFACTURED BY THE SAME

CROSS-REFERENCES TO RELATED APPLICATION

The present application claims priority under 35 U.S.C. § 119(a) to Korean application number 10-2022-0093351, filed on Jul. 27, 2022, in the Korean Intellectual Property Office, which is incorporated herein by reference in its entirety.

BACKGROUND

1. Technical Field

Various embodiments generally relate to a method of manufacturing a semiconductor package and a semiconductor package manufactured by the method.

2. Related Art

A fan-out packaging technology with respect to a multi-layered structure as a next generation package platform may have been developed. The fan-out packaging technology may use a bonding process using a wire vertically extended from a chip pad in place of a bonding finger to electrically connect the chip pad with a substrate. The fan-out technology may include a molding process and a grinding process. The fan-out technology may further include a redistribution process for forming a redistribution layer (RDL) on an upper surface of a molding member. When an input/output terminal such as a solder ball is attached to the bonding pad of each of chips having a fine pitch, the RDL may be a metal line extended from the bonding pad to an outside to provide the input/output terminals with a wide gap, thereby preventing an electrical short between the input/output terminals.

The stack fan-out technology may perform a photoresist process using a wire attachment surface as an alignment key exposed after the molding process and the grinding process. However, the wire attachment surface may be very small. Further, a smear may be generated by the grinding process so that the wire attachment surface might not have a uniform shape. Thus, the wire attachment surface may be improper as the alignment key.

A copper pillar bump (CPB) may be applied to a top die to generate an alignment key of a multi-stack package. The CPB may have an area relatively larger than the area of the wire attachment surface so that the CPB may be readily recognized. Further, copper, having hardness greater than gold, may be exposed in the grinding process to reduce a risk with respect to the smear.

However, the CPB process may include the additional process for forming the alignment key so that the time and cost for manufacturing the multi-stack package may be increased.

SUMMARY

Example embodiments may provide a method of manufacturing a semiconductor package that may be capable of electrically connecting a semiconductor chip using a reverse wire bonding process and forming an alignment key having a large exposed area so that an additional process for forming the alignment key might not be required to reduce a time and a cost for manufacturing the semiconductor package.

Example embodiments also provide a semiconductor package including a conductive bump as an alignment key for forming a redistribution pattern.

In accordance with the present disclosure is a method of manufacturing a semiconductor package. The method includes forming a multi-stack structure by stacking at least three semiconductor chips on a carrier substrate with an offset to expose chip pads of the semiconductor chips. The method also includes forming a vertical wire bond by bonding one end of a metal wire to a is chip pad of a semiconductor chip under the second-highest semiconductor chip in the multi-stack structure. The method further includes forming a reverse wire bond by bonding one end of a reverse wire to a chip pad of the second-highest semiconductor chip and connecting the other end of the reverse wire to a conductive bump on a chip pad of the uppermost semiconductor chip in the multi-stack structure. The method additionally includes molding the multi-stack structure with the vertical wire bond and the reverse wire bond using a mold layer. The method moreover includes processing the mold layer to expose the conductive bump, the other end of the metal wire in the vertical wire bond, and the other end of the reverse wire in the reverse wire bond through an upper surface of the mold layer.

BRIEF DESCRIPTION OF THE DRAWINGS

The above and another aspects, features, and advantages of the subject matter of the present disclosure will be more clearly understood from the following detailed description taken in conjunction with the accompanying drawings, in which.

DETAILED DESCRIPTION

Various embodiments of the present teachings will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present teachings as defined in the appended claims.

The present teachings are described herein with reference to cross-section and/or plan illustrations of idealized embodiments of the present teachings. However, embodiments of the present teachings should not be construed as limiting the novel concept. Although a few embodiments of the present teachings will be shown and described, it will be appreciated by those of ordinary skill in the art that changes may be made in these embodiments without departing from the principles and spirit of the present teachings.

Figure 1:
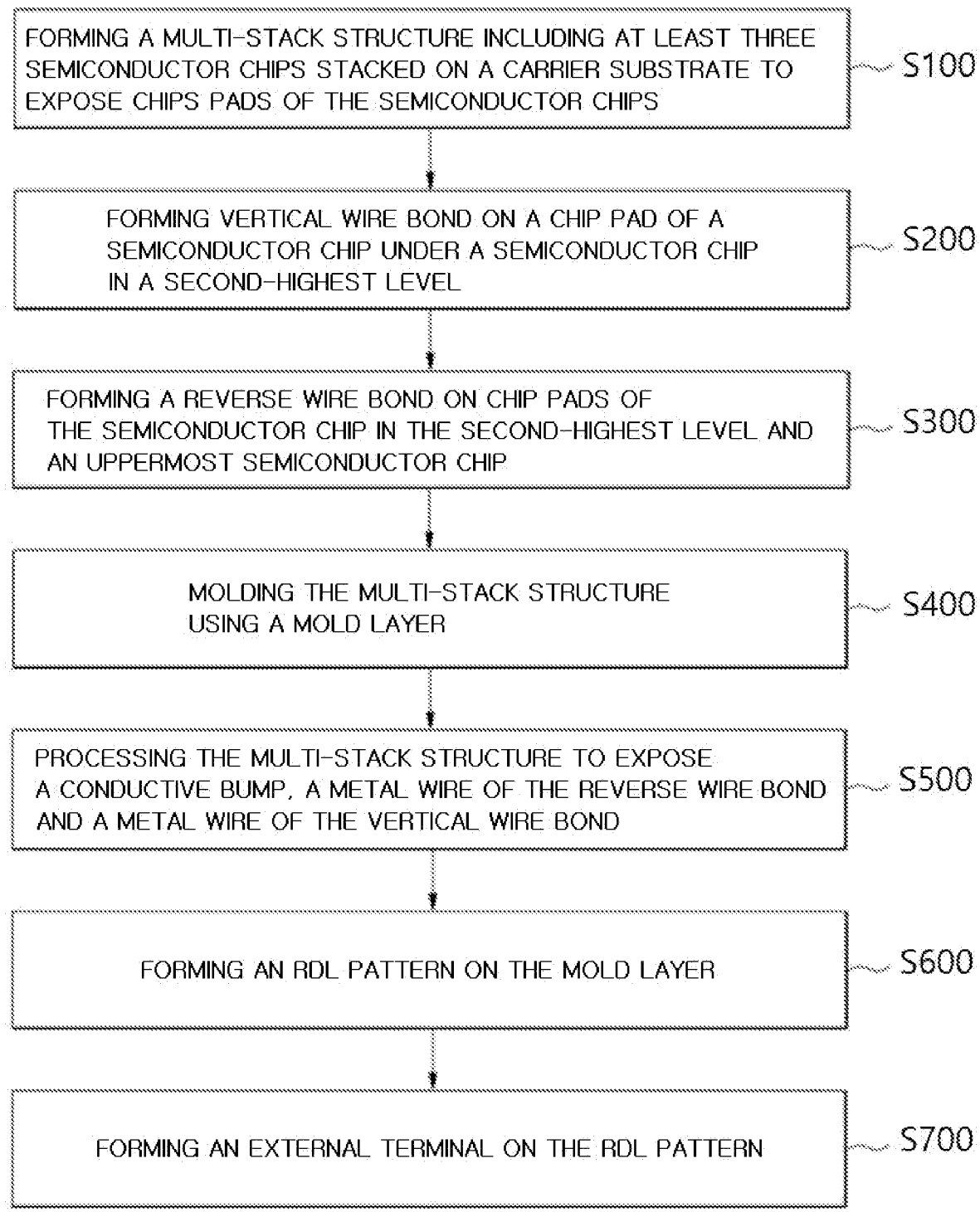
FIG. 1 is a flow diagram illustrating a method of manufacturing a semiconductor package in accordance with an embodiment.
Figure 2:
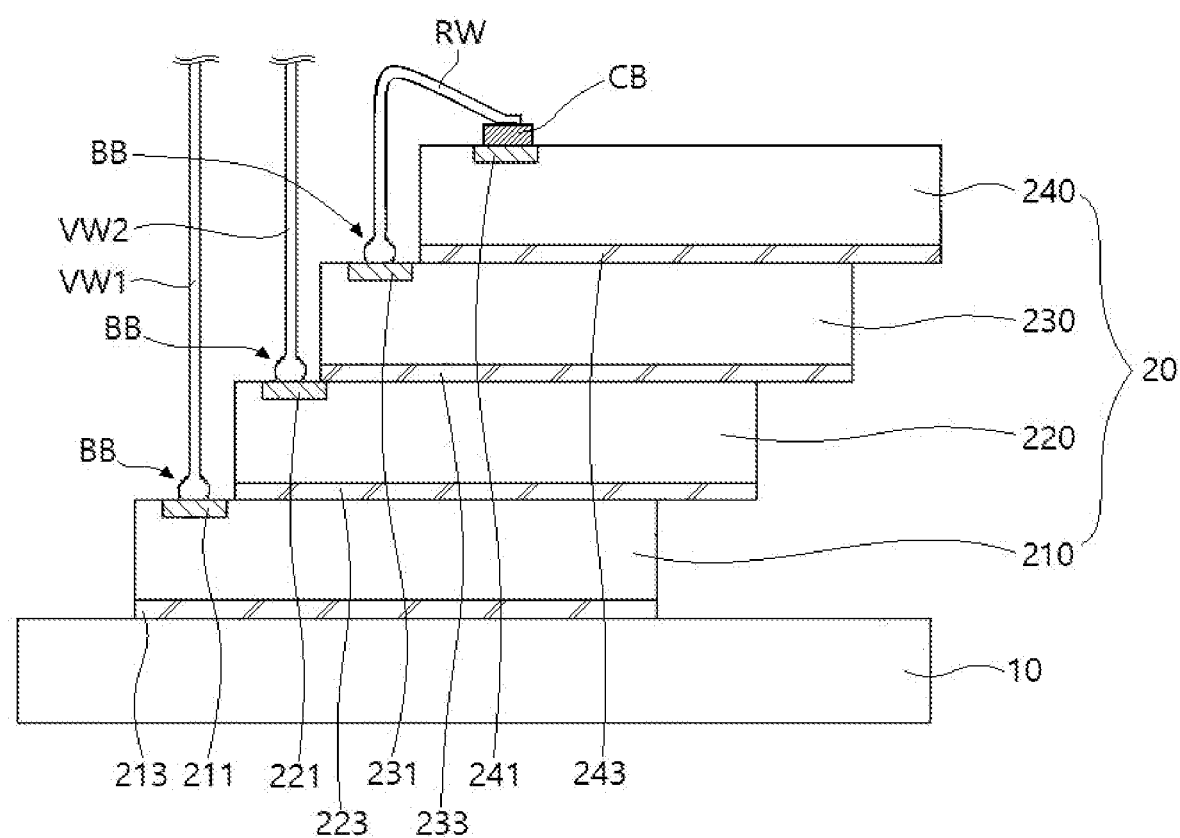
FIG. 2 is a view illustrating a chip stack structure, a carrier substrate, a vertical wire, and a reverse wire having a four-level structure manufactured by a method in accordance with an embodiment.

FIG. 1 is a view illustrating a method of manufacturing a semiconductor package in accordance with an embodiment and FIG. 2 is a view illustrating a chip stack structure, a carrier substrate, a vertical wire, and a reverse wire having a four-level structure is manufactured according to an embodiment.

Referring to FIGS. 1 and 2, a method of manufacturing a semiconductor package in accordance with the present disclosure may include a step S100 for forming a multi-stack structure on a carrier substrate, a step S200 for forming a vertical wire bond at a chip pad of a lower semiconductor chip in the multi-stack structure, a step S300 for forming a reverse wire bond on chip pads of a semiconductor chip in a second-highest level and an uppermost semiconductor chip in the multi-stack structure, a step S400 for forming a mold layer to mold the multi-stack structure, and a step S500 for processing the mold layer.

In the step S100 for forming the multi-stack structure on the carrier substrate, at least three semiconductor chips may be stacked on the carrier substrate 10 to form the multi-stack structure 20. Chip pads on an upper surface of each of the semiconductor chips may be exposed. Thus, the multi-stack structure 20 may include the at least three semiconductor chips stacked on an upper surface of the carrier substrate 10.

The carrier substrate 10 may be configured to support the semiconductor chips. The carrier substrate 10 may be readily from the multi-stack structure 20 in a packaging process to form the semiconductor package. The carrier substrate 10 may include a printed circuit board (PCB), a lead frame, a tape automated bonded tape (TAB tape), etc. The carrier substrate 10 may include a glass carrier substrate, a ceramic carrier substrate, a wafer, etc. A plurality of the semiconductor packages may be simultaneously formed on the carrier substrate 10.

Hereinafter, for convenience of description, as shown in FIG. 2, the multi-stack package 20 may include four semiconductor chips 210, 220, 230, and 240 stacked on the carrier substrate 10. The multi-stack structure 20 may include the first semiconductor chip 210, the second semiconductor chip 220, the third semiconductor chip 230, and the fourth semiconductor chip 240 in accordance with distances from the carrier substrate 10.

Further, a position relatively adjacent to the carrier substrate 10 in a vertical direction may be referred to as a lower position or a lower level. A position relatively remote from the carrier substrate 10 in the vertical direction may be referred to as an upper position or an upper level. For example, the first semiconductor chip 210 may be positioned in a lowermost level of the multi-stack structure 20. The fourth semiconductor chip 240 may be positioned in an uppermost level of the multi-stack structure 20. The third semiconductor chip 230 may be positioned in a second-highest level of the multi-stack structure 20. However, when the semiconductor package may be reversed, the lower position or the lower level and the upper position or the upper level may be reversed.

Each of the first to fourth semiconductor chips 210, 220, 230, and 240 may have a rectangular parallelepiped shape having an upper surface, a lower surface and four side surfaces. The upper surface may correspond to an active surface. The lower surface may correspond to an inactive surface. However, the shapes and the structures of the semiconductor chips may be variable. For example, the semiconductor chip may include an active surface not facing the upper surface of the carrier substrate 10 and an inactive surface opposite to the active surface.

In drawings, the multi-stack structure 20 may include the four semiconductor chips 210, 220, 230, and 240, but is not limited thereto. That is, numbers of the semiconductor chips in the multi-stack structure 20 may be variously changed. Further, the multi-stack structure 20 may include at least two stacked semiconductor chips.

Figure 3:
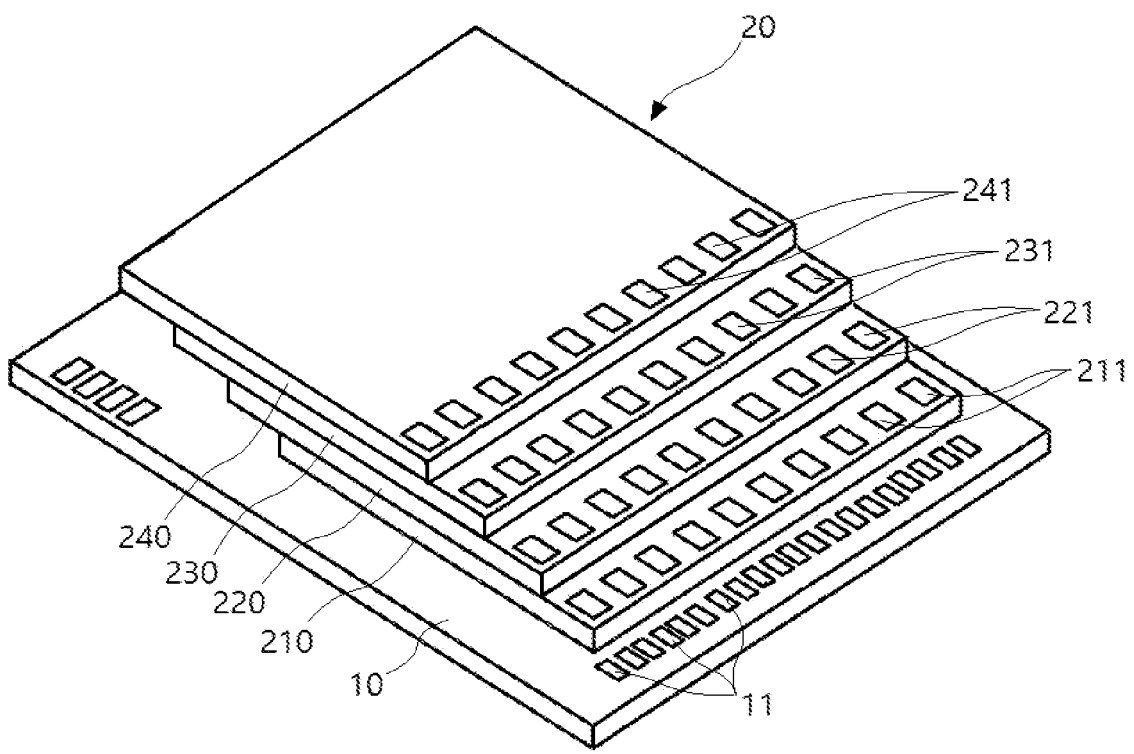
FIG. 3 is a view illustrating a chip stack structure having a four-level structure manufactured according to an embodiment.

FIG. 3 is a view illustrating a chip stack structure having a four-level structure manufactured according to an embodiment.

Referring to FIGS. 2 and 3, in step S100, the semiconductor chips may be stacked on the carrier substrate 10 to form the multi-stack structure 20 having a stepped structure. The semiconductor chips may have a uniform offset in a direction. Thus, the multi-stack structure 20 may include the four levels of the stacked semiconductor chips having chips pads exposed.

Particularly, the first to fourth semiconductor chips 210, 220, 230, and 240 may be offset-stacked to form the multi-stack structure 20. Other edges of upper surfaces in the first to fourth semiconductor chips 210, 220, 230, and 240 opposite to an offset direction may be exposed by the offset stack. First to fourth chip pads 211, 221, 231, and 241 may be arranged on the upper surfaces of the first to fourth semiconductor chips 210, 220, 230, and 240. The first to fourth semiconductor chips 210, 220, 230, and 240 may include an edge pad type semiconductor chip. Because the fourth semiconductor chip 240 may be positioned in the uppermost level of the multi-stack structure 20, the active surface of the fourth semiconductor chip 240 may be wholly exposed. Thus, a position of the fourth chip pad 241 might not be restricted within a specific position. In an embodiment, the fourth chip pad 241 may be located at a left edge portion of the active surface of the fourth semiconductor chip 240 corresponding to positions of the first to third chip pad 211, 221, and 231.

The first to fourth semiconductor chips 210, 220, 230, and 240 may each include at least one chip pad 211, 221, 231, and 241 arranged on the upper surfaces of the first to fourth semiconductor chips 210, 220, 230, and 240, respectively. For example, the first semiconductor chip 210 may include the single first chip pad 211. The second semiconductor chip 220 may include the single second chip pad 221. The third semiconductor chip 230 may include the single third chip pad 231. The fourth semiconductor chip 240 may include the single fourth chip pad 241. Alternatively, the first semiconductor chip 210 may include at least two first chip pads 211. The first chip pads 211 may be spaced apart from each other by a uniform gap. The second semiconductor chip 220 may include at least two single second chip pads 221. The second chip pads 221 may be spaced apart from each other by a uniform gap. The third semiconductor chip 230 may include at least two third chip pads 231. The third chip pads 231 may be spaced apart from each other by a uniform gap. The fourth semiconductor chip 240 may include at least two fourth chip pads 241. The fourth chip pads 241 may be spaced apart from each other by a uniform gap.

The chip pads of the semiconductor chips may correspond to a signal pad, a power pad, etc. Input/output signals may be applied to the signal pad. A power voltage or a ground voltage may be applied to the power pad. Thus, numbers and positions of the signal pad and the power pad may be variously changed. The semiconductor chip may include desired chips pads.

Further, the semiconductor chips may have a same function or different functions.

In an embodiment, the semiconductor chips may include a memory chip. For example, the semiconductor chip may include a NAND flash memory chip, but is not limited thereto. The semiconductor chip may include a non-volatile memory chip such as a phase-change random access memory (PRAM) chip, a magenetoresistive random access memory (MRAM) chip, a dynamic random access memory (DRAM) chip, a mobile DRAM chip, a static random access memory (SRAM) chip, etc.

The multi-stack structure 20 may include an adhesive interposed between the semiconductor chips.

Particularly, referring to FIG. 2, the multi-stack structure 20 may include an adhesive 213, 223, 233, and 243 interposed between the semiconductor chips. The adhesive 213, 223, 233, and 243 may be arranged on lower surfaces of the first to fourth semiconductor chips 210, 220, 230, and 240. The first to fourth semiconductor chips 210, 220, 230, and 240 with the adhesive 213, 223, 233, and 243 may be attached to the upper surfaces of the carrier substrate 10 and the upper surfaces of the first to third semiconductor chips 210, 220, and 230 to form the multi-stack structure 20. The adhesive 213, 223, 233, and 243 may include an insulating adhesive material such as a die attach film (DAF), not limited thereto. For example, the adhesive 213, 223, 233, and 243 may include a liquid adhesive.

Thus, the adhesive 213 may be attached to the lower surface of the first semiconductor chip 210. The adhesive 213 may be attached to the upper surface of the carrier substrate 20. The adhesive 223 may be formed on the upper and lower surface of the first semiconductor chip 210. The second semiconductor chip 220 with the second adhesive 223 may be offset-stacked in the offset direction. The above-mentioned process may be repeated to stack the semiconductor chips, thereby forming the multi-stack structure 20. The adhesive may be both-sided so that the adhesive between two semiconductor chips adheres to both the semiconductor chip above and below the adhesive.

In step S200 for forming the vertical wire bond at the chip pad of the lower semiconductor chip in the multi-stack structure, one end of a metal wire may be bonded to the chip pad of the lower semiconductor chip under the semiconductor chip in the second-highest level in the multi-stack structure to form the vertical wire bond. The lower semiconductor chip may correspond to semiconductor chips under the uppermost semiconductor chip and the semiconductor chip in the second-highest level in the multi-stack structure including the at least three semiconductor chips. That is, when the at least three semiconductor chips are stacked in the multi-stack structure, the lower semiconductor chip may be at least one.

In an embodiment, the multi-stack structure 20 may include n number of the semiconductor chips. An nth semiconductor chip may correspond to the uppermost semiconductor chip. A (n−1)th semiconductor chip may correspond to the semiconductor chip in the second-highest level. A (n−3)th semiconductor chips may correspond to the lower semiconductor chip in the low level. When the multi-stack structure may include the four semiconductor chips, the (n−2)th semiconductor chip may correspond to the second semiconductor chip. The (n−3)th semiconductor chip may correspond to the first semiconductor chip. The (n−1)th semiconductor chip may correspond to the third semiconductor chip. The (n)th semiconductor chip may correspond to the fourth semiconductor chip.

Referring to FIG. 2, in step S200, the vertical wire bond may be formed at the chip pads 211 and 221 of the first and second semiconductor chips. The vertical wire bond may include vertical wires VW1 and VW2 vertically extended from the upper surfaces of the semiconductor chips. The vertical wire bond may include a metal wire. One end of the metal wire may be bonded to the chips pads 211 and 221 of the first and second semiconductor chips. The other end of the metal wire may be upwardly exposed.

In step S200, various manners for forming the vertical wire bonds on the chip pad of the semiconductor chip may be used. For example, one end of the metal wire may be bonded to the chip pad using a wire bonding machine to form the vertical wire bond including the exposed other end of the metal wire. The vertical wire may include materials used for forming the semiconductor package such as Au, Ag, Cu, Pt, or an alloy thereof welded on the chip pad by microwave energy and/or heat.

The vertical wire bond may include a bonding ball BB on the one end of the metal wire formed using the wire bonding machine. The wire bonding machine may include a plasma arc, a capillary, etc. The bonding ball BB may be formed on the one end of the metal wire using the wire bonding machine. The bonding ball BB may be bonded to the chip pad. The other end of the metal wire may be upwardly drawn from the chip pad using the wire bonding machine. When the other end of the metal wire may be extended to a desired position, the other end of the metal wire may then be cut to form the vertical wire bond on the bonding pad of the semiconductor chip. Thus, as shown in FIG. 2, the metal wire may be extended from the chip pad to form the first and second vertical wires VW1 and VW2 on the chip pads 211 and 221 of the semiconductor chip.

In step S300 for forming the reverse wire bond on the chip pads of the semiconductor chip in the second-highest level and the uppermost semiconductor chip in the multi-stack structure, the bonding ball BB on the one end of the metal wire may be bonded to the chip pad of the semiconductor chip in the second-highest level. The other end of the metal wire may be bonded to the conductive bump CB on the chip pad of the uppermost semiconductor chip to form the reverse wire RW connected between the semiconductor chip in the second-highest level and the uppermost semiconductor chip.

Figure 4:
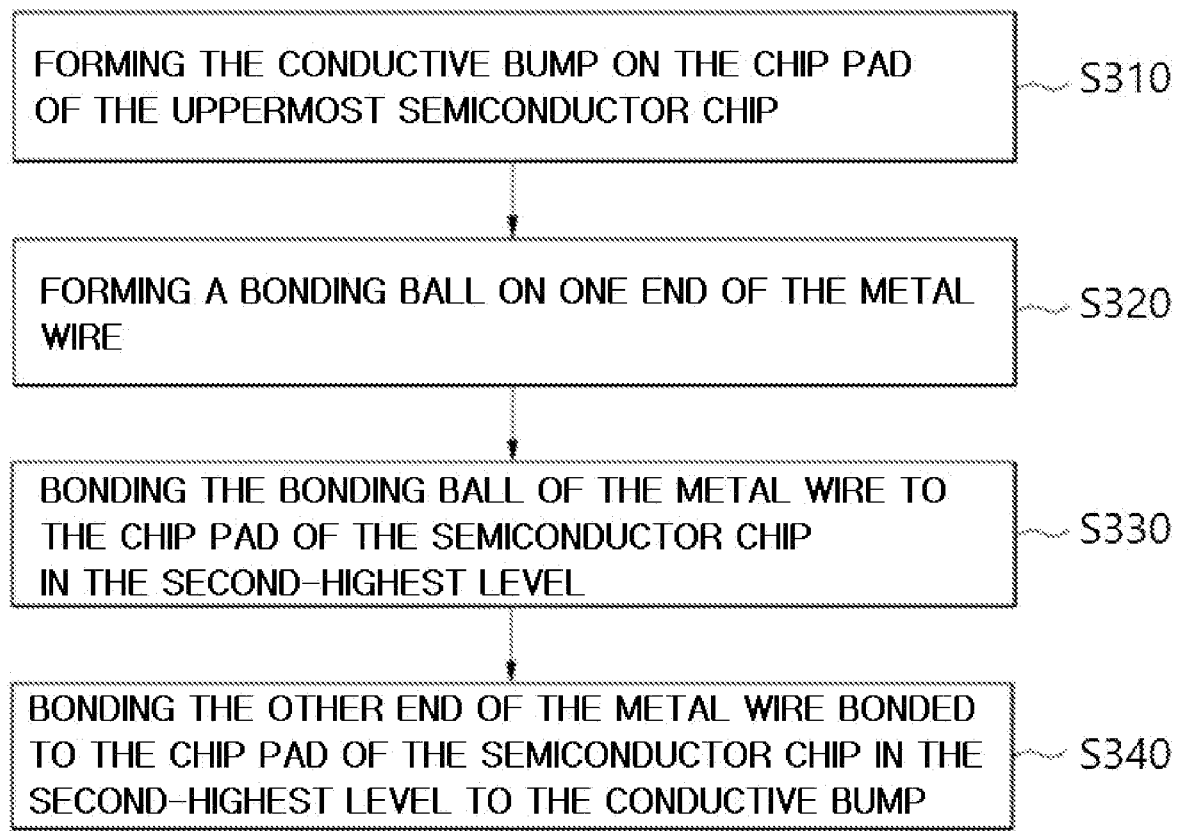
FIG. 4 is a flow diagram illustrating a process for forming a reverse wire bond in accordance with an embodiment.

FIG. 4 is a flow diagram illustrating a process for forming a reverse wire bond in accordance with an embodiment.

Referring to FIGS. 2 and 4, the reverse wire bonding process may include step S310 for forming the conductive bump CB on the chip pad of the uppermost semiconductor chip, step S320 for forming the bonding ball BB on the one end of the metal wire, step S330 for bonding the bonding ball BB of the metal wire to the chip pad of the semiconductor chip in the second-highest level, and step S340 for bonding the other end of the metal wire, which may be bonded top the chip pad of the semiconductor chip in the second-highest level, to the conductive bump CB.

Particularly, in step S310, the conductive bump CB may be formed on the chip pad of the uppermost semiconductor chip. The conductive bump CB may be formed by supplying a conductive wire to the capillary, melting the conductive wire and attaching the melted conductive wire to the chip pad of the uppermost semiconductor chip 240. The conductive wire may be melt using various apparatuses for melting the conductive wire. For example, the conductive wire may be melted by an apparatus using plasma arcing to form a melted material having a ball shape. The melted material may be attached to the chip pad to form the conductive bump CB.

In step S320, a metal wire may be supplied to the capillary to form the bonding ball BB on the one end of the metal wire.

In step S330, the ball of the metal wire may be attached to the chip pad of the semiconductor chip in the second-highest level.

In step S340, the metal wire having the one end bonded to the chip pad of the semiconductor chip in the second-highest level may be bent to the chip pad of the uppermost semiconductor chip. The other end of the metal wire may be compressed to attach the other end of the metal wire to the conductive bump CB. The reverse wire bonding process such as a stitch bonding may be performed to form the reverse wire RW connected between the uppermost semiconductor chip 240 and the semiconductor chip 230 in the second-highest level.

Particularly, the conductive bump CB on the uppermost semiconductor chip of the multi-stack structure may be used for an alignment key for forming an RDL (redistribution layer) pattern. The conductive bump CB may be configured to electrically connect the uppermost semiconductor chip with the RDL pattern together with the vertical wire bond in forming the RDL pattern. Further, the reverse wire RW may be processed in a following process to form a third vertical wire RW-VW3 vertically extended from the chip pad of the semiconductor chip in the second-highest level.

In example embodiments, the conductive bump CB on the chip pad of the uppermost semiconductor chip may have variable sizes.

Particularly, the size of the conductive bump CB may be changed by controlling a diameter of the conductive wire supplied to the capillary. Thus, a size of the alignment key on the uppermost semiconductor chip may also be controlled. As a result, the alignment key on the uppermost surface of the multi-stack structure 20 may have a large exposed area. The conductive bump CB may be used for the alignment key in a photolithography process for forming the RDL pattern. Thus, it may not be required to perform an additional process for forming the alignment key so that the time and cost for manufacturing the semiconductor package may be reduced.

Figure 5:
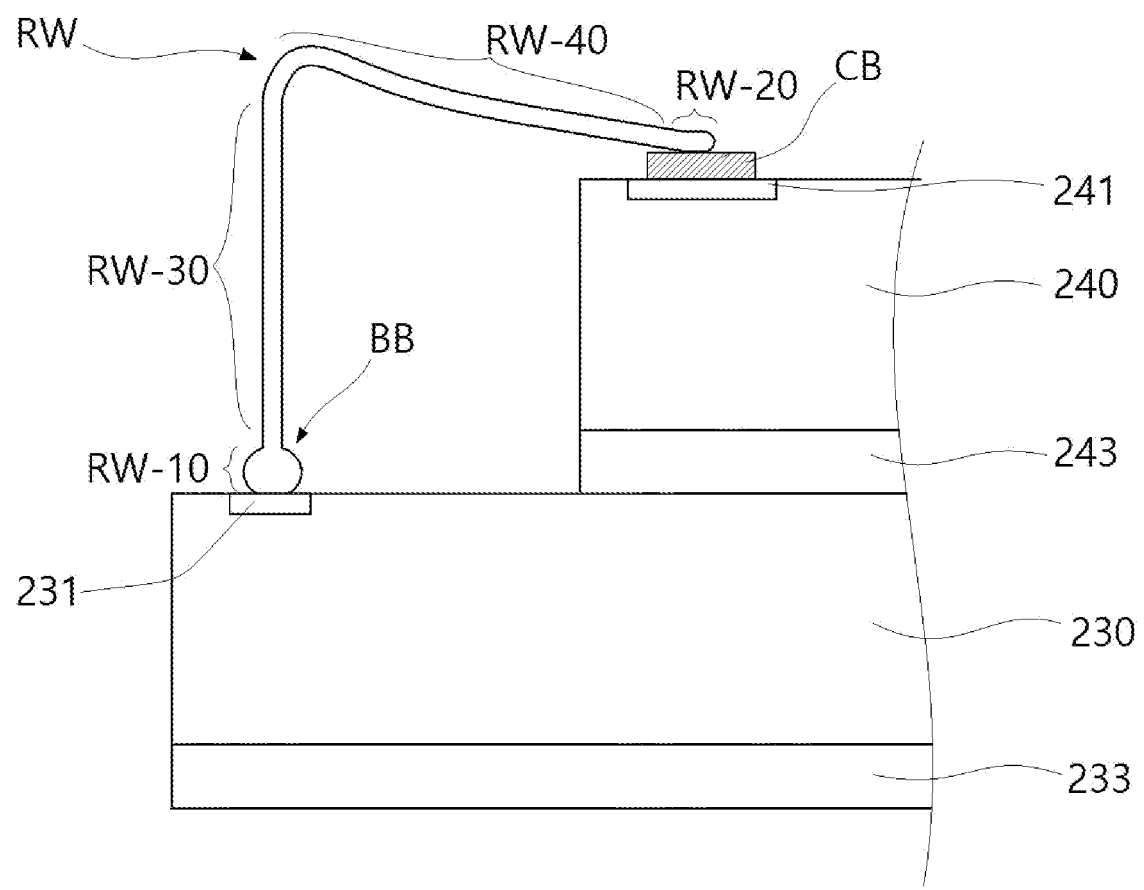
FIG. 5 is a view illustrating a structure of a metal wire in reverse wire bond formed at an uppermost semiconductor chip and a semiconductor chip in a second-highest level in a four-level multi-layered structure in accordance with an embodiment.

FIG. 5 is a view illustrating a structure of a metal wire in reverse wire bond formed at an uppermost semiconductor chip 240 and a semiconductor chip 230 in a second-highest level in a four-level multi-layered structure in accordance with an embodiment.

Referring to FIG. 5, the reverse wire may include a first combination portion RW-10, a second combination portion RW-20, a vertical portion RW-30, and a bent connection portion RW-40. The first combination portion RW-10 may include the bonding ball BB combined with the chip pad of the semiconductor chip 230 just below the uppermost semiconductor chip 240. The second combination portion RW-20 may be formed on the other end of the metal wire RW. The second combination portion RW-20 may be combined with the conductive bump CB on the chip pad of the uppermost semiconductor chip 240. The vertical portion RW-30 may be connected to the first combination portion RW-10. The vertical portion RW-30 may be vertically extended over the chip pad 231. The bent connection portion RW-40 may be connected between the vertical portion RW-30 and the second combination portion RW-20 to combine the conductive bump CB on the chip pad 241 of the uppermost semiconductor chip 240 with the other end of the metal wire.

The second combination portion RW-20 and the bent connection portion RW-40 may be covered with a mold layer 30 on the multi-stack structure in a molding process. The second combination portion RW-20 and the bent connection portion RW-40 may be removed together with the mold layer 30 in processing the mold layer 30. Thus, the other end of the vertical portion RW-30 in the reverse wire bond and the conductive bump CB may be exposed through an upper surface of the mold layer 30.

In step S400 for forming a mold layer to mold the multi-stack structure, the multi-stack structure with the vertical wire bond and the reverse wire bond may be molded using the mold layer 30. The mold layer 30 may be formed by manners for manufacturing the semiconductor package.

In step S500 for processing the mold layer, the multi-stack structure 20 with the mold layer 30 may be processed to expose a surface of the conductive bump CB, the other end of the metal wire in the vertical wire bond and the other end of the metal wire in the reverse wire bond through the upper surface of the mold layer 30.

In step S500, the mold layer 30 may be processed by various manners for manufacturing the semiconductor package such as a mechanical polishing or a chemical polishing. For example, the mold layer 30 may be grinded to form a flat surface of the mold layer higher than the upper surface of the carrier substrate 10. A height of the flat surface may be higher than a height of the upper surface of the multi-stack structure 20. The mold layer 30 may be processes until the conductive bump CB may be exposed. Thus, the exposed conductive bump CB may be used as the alignment key.

The second combination portion RW-20 and the bent connection portion RW-40 connected with the conductive bump CB in the reverse wire bond may be removed in processing the mold layer to form a third vertical wire RW-VW3 including the first combination portion RW-10 and the vertical portion RW-30. The third vertical wire RW-VW3 may include a metal wire vertically extended over the chip pad of the semiconductor chip 230 in the second-highest level.

According to example embodiments, the one end of the metal wire may be connected to the semiconductor chip 230 in the second-highest level. The other end of the metal wire may be connected to the conductive bump CB on the uppermost semiconductor chip 240. The mold layer may be processed to remove the reverse wire bond RW in the final structure of the semiconductor package. The third vertical wire RW-VW3 by the reverse wire bond may be formed on the semiconductor chip 230 in the second-highest level. The conductive bump CB may be formed on the uppermost semiconductor chip 240. The RDL pattern may be electrically connected with the conductive bump CB to complete the semiconductor package.

FIG. 6A to 6D are cross-sectional views illustrating a multi-stack structure by a vertical wire bond, a multi-stack structure by a reverse wire bond, a multi-stack structure with a mold layer, and a multi-stack structure with a processed mold layer, respectively, in accordance with example embodiments.

Figure 6A:
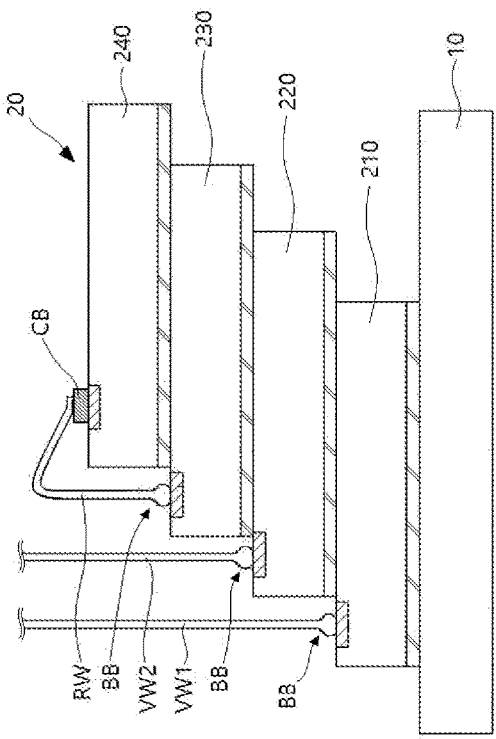
FIGS. 6A to 6D are cross-sectional views illustrating a multi-stack structure by a vertical wire bond, a multi-stack structure by a reverse wire bond, a multi-stack structure with a mold layer, and a multi-stack structure with a processed mold layer, respectively, in accordance with example embodiments.

Referring to FIG. 6A, the vertical wire bonds VW1 and VW2 may be formed at the chip pads of the first 210 and second 220 semiconductor chips in the multi-stack structure 20.

Figure 6B:
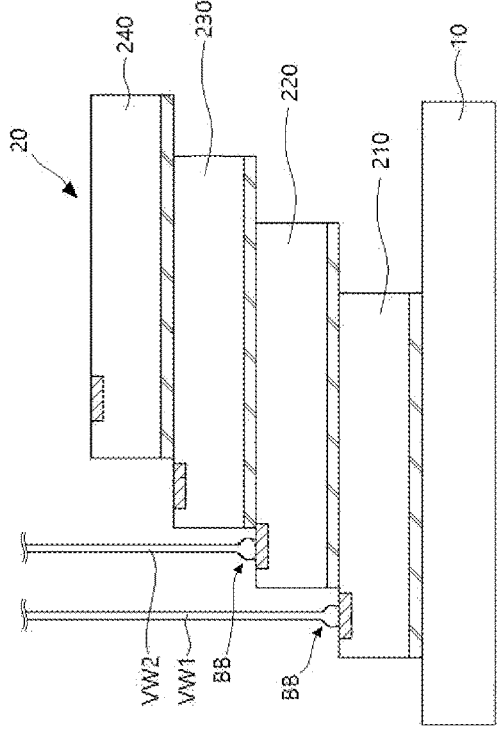

Referring to FIG. 6B, the reverse wire bond RW may be connected between the chip pad of the semiconductor chip 230 in the second-highest level and the chip pad of the uppermost semiconductor chip 240. The conductive bump CB may be formed on the chip pad of the uppermost semiconductor chip 240. The one end of the reverse wire bond RW may be connected to the chip pad of the semiconductor chip 230 in the second-highest level. The other end of the reverse wire bond RW may be connected to the conductive bump CB of the uppermost semiconductor chip.

Figure 6C:
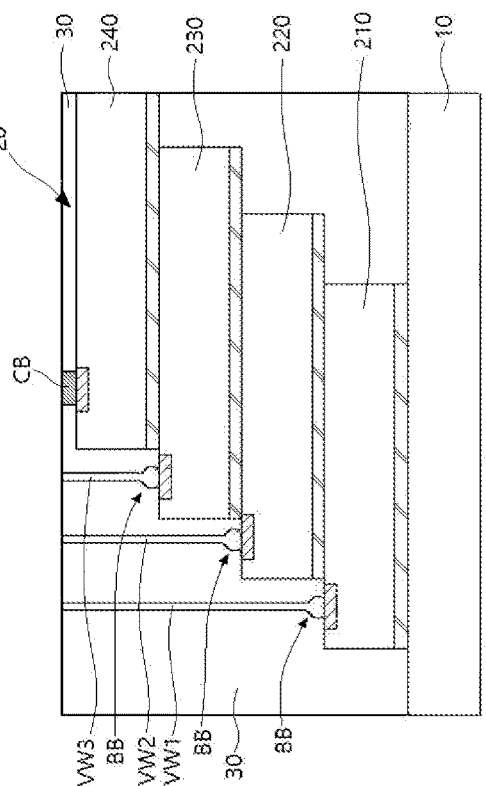

Referring to FIG. 6C, the mold layer 30 may be formed on the carrier substrate 10 of the multi-stack structure 20. The mold layer 30 may have a thickness for sufficiently covering the uppermost semiconductor chip 240 and the reverse wire bond RW. The mold layer 30 may be formed by filling a space of a mold die with a molding material and curing the molding material.

Figure 6D:
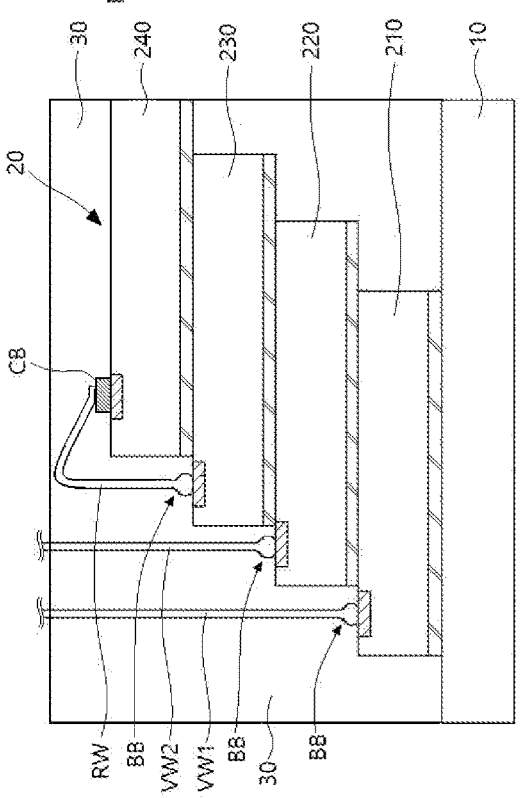

Referring to FIG. 6D, the multi-stack structure 20 with the mold layer 30 may be processed to form the vertical wire bonds VW1 and VW2 of the first 210 and second 220 semiconductor chips, the vertical wire RW-VW3 formed by the reverse wire bond of the semiconductor chip 230 in the second-highest level and the conductive bump CB of the uppermost semiconductor chip 240.

The RDL pattern may then be formed on the semiconductor package. The external terminals may be mounted on the semiconductor package.

Figure 7:
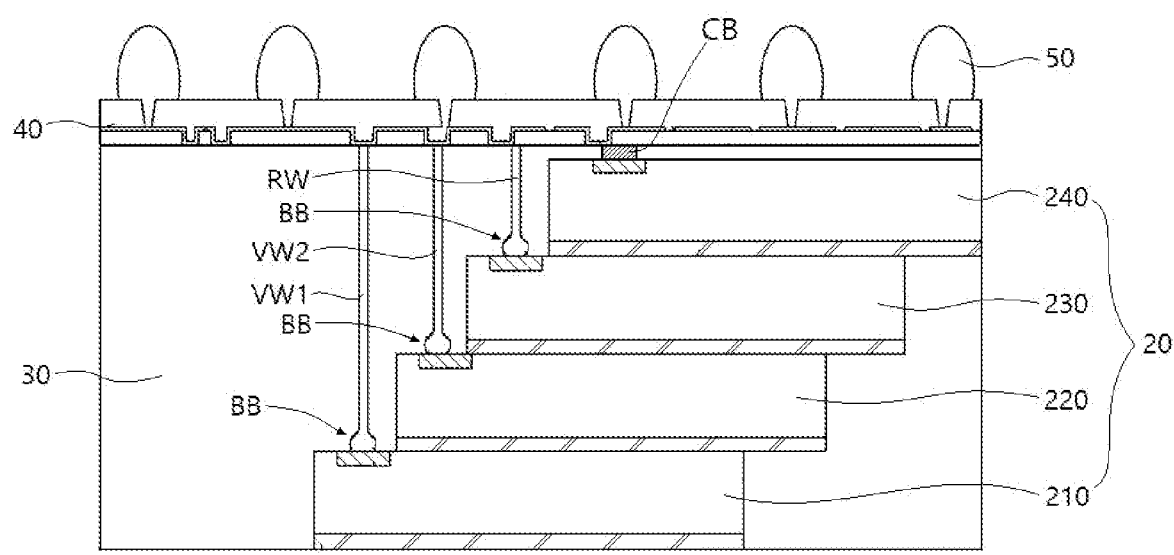
FIG. 7 is a cross sectional view illustrating a semiconductor package including a four-level multi-stack structure manufactured by a method in accordance with an embodiment.
Figure 8:
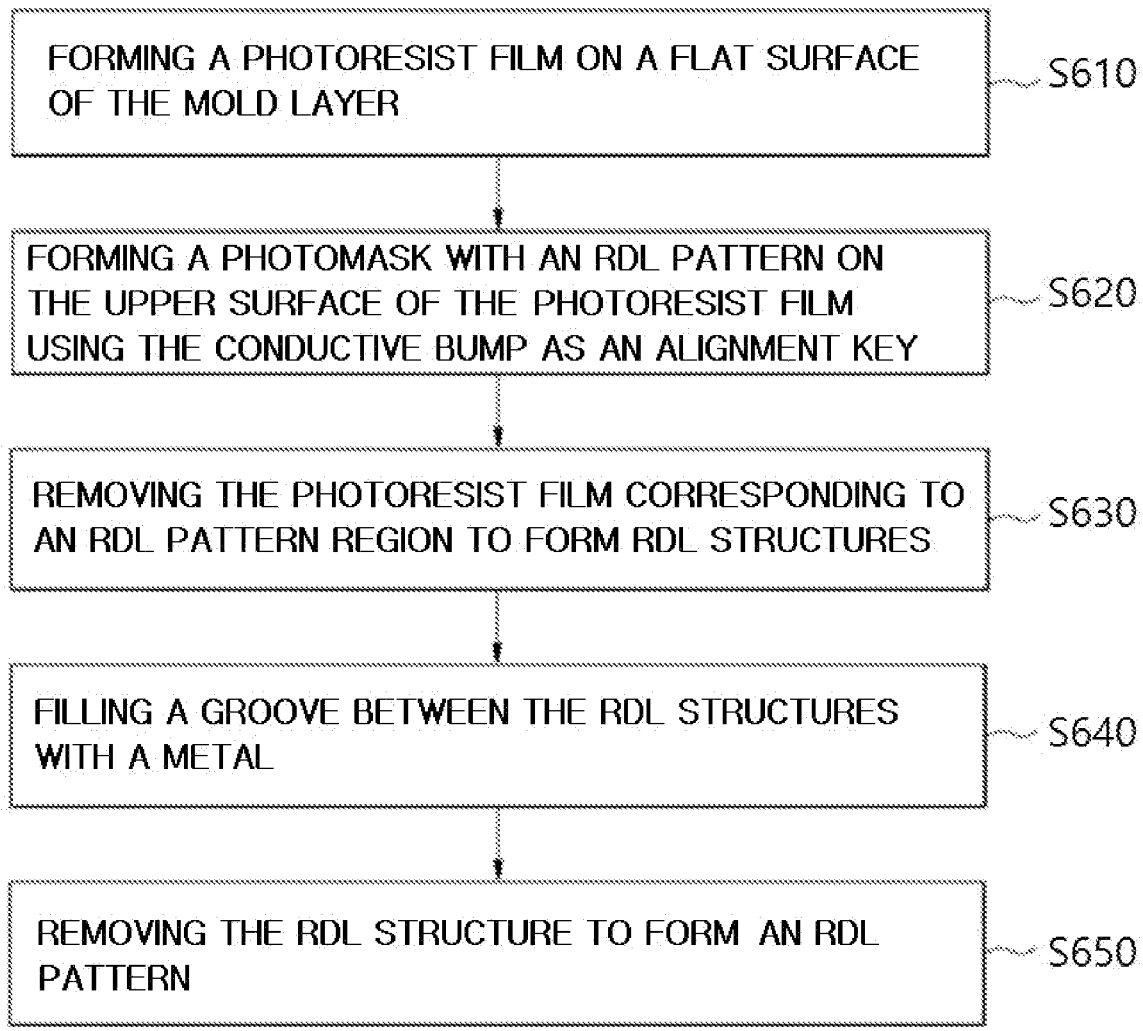
FIG. 8 is a flow diagram illustrating a process for forming a redistribution pattern in accordance with an embodiment.

FIG. 7 is a cross sectional view illustrating a semiconductor package including a four-level multi-stack structure manufactured by a method in accordance with an embodiment and FIG. 8 is a flow diagram illustrating a process for forming a redistribution pattern in accordance with an embodiment.

Referring to FIG. 7, the RDL pattern 40 and the external terminals 50 may be formed on the flat surface of the mold layer 30.

Particularly, step S600 for forming the RDL pattern 40 may include forming the RDL pattern 40 on the flat surface of the mold layer 30. The RDL pattern 40 may be formed by a photolithography process.

Referring to FIG. 8, forming the RDL pattern 40 using the photolithography process may include step S610 for forming a photoresist film on the flat surface of the mold layer 30, step S620 forming a photomask with an RDL pattern on an upper surface of the photoresist film using the conductive bump CB of the reverse wire bond as an alignment key, step S630 for irradiating a light to the photomask to remove the photoresist film corresponding to an RDL pattern region, thereby forming an RDL structure, step S640 for plating a metal in a groove between the RDL structures, and step S650 for removing the RDL structure to form the RDL pattern.

In step S610, the photoresist film may be formed by coating a photoresist on the flat surface of the mold layer 30. The photoresist film may be dissolved or hardened by a light to form an embossed or engraved RDL structure. Particularly, the photoresist film may include a mixture containing a photosensitive resin such as polymethyl methacrylate to have the engraved structure by the light.

In step S620, the photomask with the RDL pattern may be arranged on the upper surface of the photoresist film. The photomask may be aligned using the conductive bump CB of the reverse wire bond as the alignment key.

In step S630, the light may be irradiated to the photomask to remove the photoresist film corresponding to the RDL pattern region, thereby forming the RDL structure. The photoresist film may be removed using an alkali solution such as potassium hydroxide, polymethyl methacrylate, etc. The RDL structure may be annealed by a baking process.

In step S640, the groove between the RDL structures may be filled with the metal to form the RDL pattern. In step S650, the RDL structure may then be removed to form the RDL pattern 40 on the flat surface of the mold layer 30.

The RDL pattern 40 may be connected with the chip pad of the semiconductor chip to extend the chip pad along the RDL.

Further, the photolithography process may further include coting an insulation material on the flat surface of the mold layer 30 to form a protection layer before forming the photoresist film.

The protection layer may be formed on the upper surface of the RDL pattern. The protection layer may have an opening configured to connect the external terminal with the RDL pattern.

The protection layer may include an insulation material such as polyimide, polybenzoxazole, etc.

In forming the RDL pattern, the conductive bump CB of the reverse wire may be positioned on a level substantially the same as a level of the flat surface of the mold layer 30. Further, the conductive bump CB may be exposed through the flat surface of the mold layer 30. Thus, the exposed conductive bump CB may be used as the alignment key.

The RDL pattern 40 may be variously patterned to provide the other end of the vertical wires VW1 and VW2 connected to the chip pad with being protruded from the flat surface of the mold layer 30.

Additionally, the method may further include step S700 for forming the external terminal 50 electrically connected with the RDL pattern 40. The external terminal 50 may be formed in the opening of the protection layer.

The external terminal 50 may include a solder ball, but is not limited thereto. For example, the external terminal 50 may include various electrical connectors such as a bump, a bonding wire, etc. The external terminal 50 may include gold, silver, copper, tin, nickel, etc.

A reflow process may be performed to improve an electrical connection between the RDL pattern 40 and the external terminal 50.

After forming the external terminal 50, the semiconductor package may then be cut to singulate a plurality of fan-out packages.

The carrier substrate 10 may then be removed. The removal of the carrier substrate 10 may be performed after forming the mold layer 30.

According to example embodiments, the reverse wire may be connected between the chip pads of the uppermost semiconductor chip and the semiconductor chip in the second-highest level. The mold layer may be processed to form the vertical wire bond connected with the semiconductor chip. Thus, the semiconductor package may include the alignment key having the large area.

The manufacturing method of the semiconductor package and the alignment key of the semiconductor package may be used for aligning the photomask in forming the RDL pattern using the photolithography process. Thus, it might not be required to perform the additional process for forming the alignment key so that the time and the cost for manufacturing the semiconductor package may be reduced.

Further, the method of example embodiments may be used for manufacturing the semiconductor package using a two-level type stack structure including stacked two semiconductor chips.

Particularly, the first and second semiconductor chips may be stacked on the carrier substrate to expose the chip pads, thereby forming the two-level type stack structure. The one end of the metal wire may be bonded to the chip pad of the first (lower) semiconductor chip. The other end of the metal wire may be bonded to the conductive bump CB on the chip pad of the second (upper) semiconductor chip to form the reverse wire bond. The mold layer may be formed on the two-level type stack structure. The two-level type stack structure with the mold layer may then be processed to expose the conductive bump CB and the other end of the metal wire in the reverse wire bond through the upper surface of the mold layer.

Additionally, the method using the two-level type stack structure may also include forming the RDL pattern and the external terminal.

The semiconductor package may include the multi-stack structure 20, the mold layer 30, the at least one vertical wire bond and the conductive bump CB. The multi-stack structure 20 may include the at least two semiconductor chips stacked on the carrier substrate. The chip pads of the semiconductor chips may be exposed. The mold layer 30 may be configured to mold the multi-stack structure 20. The vertical wire bond may include the one and the other end. The one end may be connected to the chip pad of the at least one semiconductor chip in the second-highest level under the uppermost semiconductor chip in the multi-stack structure 20. The other end may be vertically extended to be exposed through the upper surface of the mold layer 30. The conductive bump CB may be formed on the chip pad of the uppermost semiconductor chip in the multi-stack structure. The conductive bump CB may be exposed through the upper surface of the mold layer 30.

As shown the four-level type stack structure in FIG. 6D, the three vertical wires VW1, VW2, and RW-VW3 may be connected to the chip pads of the first to third semiconductor chips 210, 220, and 230, respectively, under the uppermost semiconductor chip. The three vertical wires VW1, VW2, and RW-VW3 may be vertically extended to be exposed through the upper surface of the mold layer. The conductive bump CB may be formed on the chip pad of the fourth semiconductor chip 240 corresponding to the uppermost semiconductor chip. The conductive bump CB may be exposed through the upper surface of the mold layer.

The vertical wire RW-VW3 on the chip pad of the semiconductor chip in the second-highest level may be formed by the following processes.

The one end of the metal wire may be bonded to the chip pad of the semiconductor chip in the second-highest level of the multi-stack structure. The other end of the metal wire may be bonded to the conductive bump CB on the chip pad of the uppermost semiconductor chip to form the reverse wire bond. The multi-stack structure may then be molded by the mold layer. The mold layer may be processed to expose the at least one vertical wire bond on the chip pad of a semiconductor chip in a third-highest level under the semiconductor chip in the second-highest level. Simultaneously, the second combination portion RW-20 and the bent connection portion RW-40 in the reverse wire bond connected to the chip pad of the semiconductor chip in the second-highest level may be removed in processing the mold layer 30 to form the vertical wire RW-VW3 on the chip pad of the semiconductor chip in the second-highest level. Thus, the semiconductor package may include the at least one vertical wire bond.

The semiconductor package may include the mold layer 30. The at least one vertical wire and the conductive bump CB of the reverse wire may be exposed through the flat surface of the mold layer 30. The conductive bump CB may be used as the alignment key having the large area for forming the RDL pattern.

The semiconductor package may include the RDL pattern 40 on the flat surface of the mold layer 30. The RDL pattern may be connected to the at least one vertical wire. Thus, the RDL pattern 40 may be electrically connected with the semiconductor chip in the multi-stack structure. The semiconductor package may include the external terminal electrically connected to the RDL pattern 40. The conductive bump CB may function to electrically connect the RDL pattern 40 with the uppermost semiconductor chip.

In FIG. 2, the semiconductor package may include the four-level type multi-stack structure 20 including the first to fourth semiconductor chips 210, 220, 230, and 240, but is not limited thereto. The semiconductor package may include an at least two-level type multi-stack structure.

Figure 9:
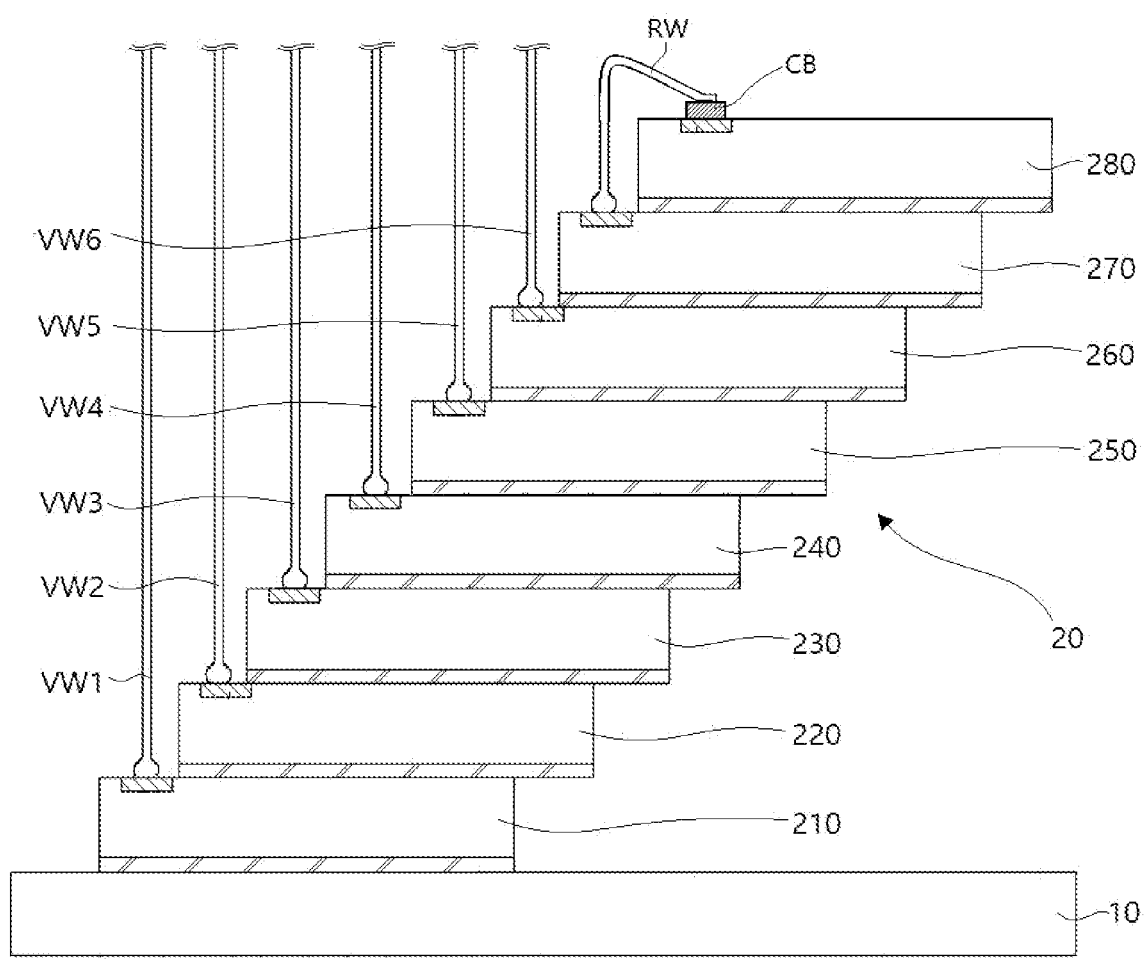
FIG. 9 is a view illustrating a semiconductor package including an eight-level multi-stack structure in accordance with an embodiment.

For example, as shown in FIG. 9, a semiconductor package may have an eight-level type structure. The semiconductor chips may be stacked in one direction to form the multi-stack structure 20.

Figure 10:
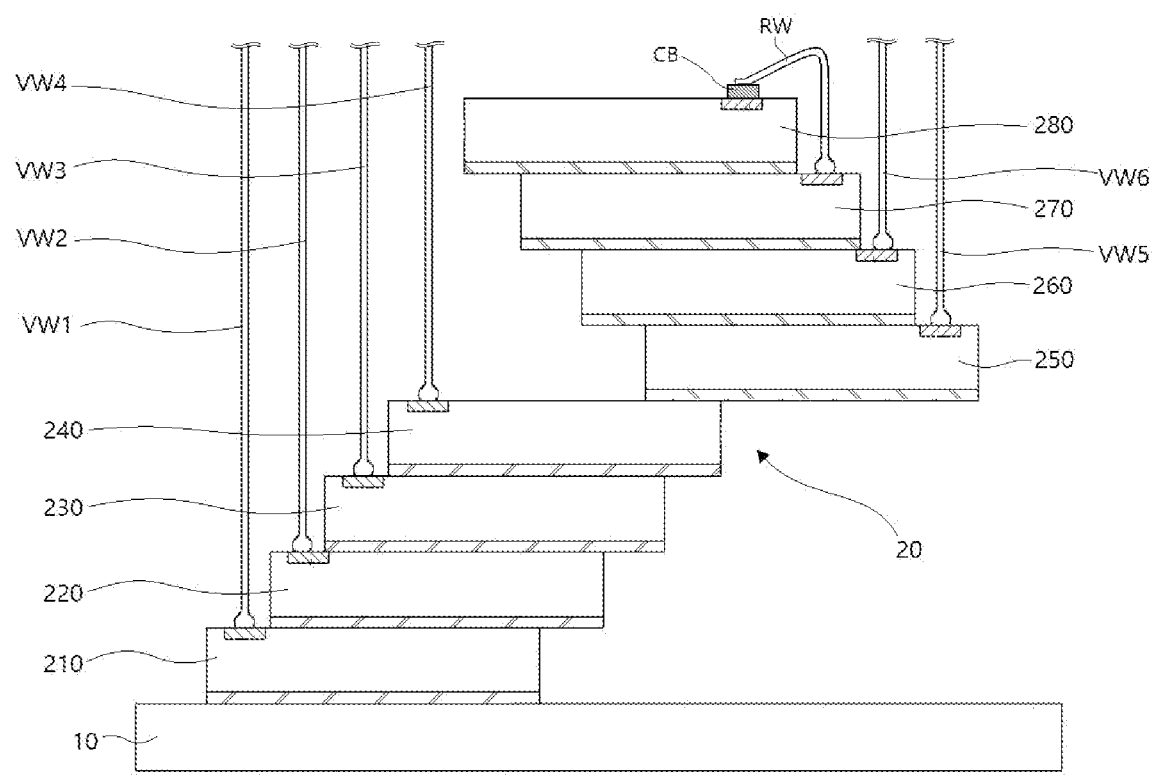
FIG. 10 is a view illustrating a semiconductor package including an eight-level multi-stack structure in accordance with an embodiment.

Further, as shown in FIG. 10, a semiconductor package having an eight-level type structure may include a multi-stack structure 20 including a lower stack and an upper stack. The lower stack may include the semiconductor chips stacked with a first offset direction to the right. The upper stack may include the semiconductor chips stacked on the lower stack with a second offset direction to the left opposite to the first offset direction.

The semiconductor package and the method of example is embodiments may be applied to various fields for manufacturing the semiconductor package including stacked semiconductor chips as well as the four-level and the eight-level type structures.

For example, the semiconductor package may include a third level type multi-stack structure, a mold layer, first and second vertical wire bonds and a conductive bump CB. The third level type multi-stack structure may include first to third semiconductor chips stacked on the carrier substrate. The chip pads of the first to third semiconductor chips may be exposed. The mold layer may be configured to mold the three-level type multi-stack structure. The first and second vertical wire bonds may include one and the other end. The one end may be connected to the chip pads of the first and second semiconductor chips. The other end may be vertically extended to be exposed through the upper surface of the mold layer. The conductive bump CB may be formed on the chip pad of the third semiconductor chip. The conductive bump CB may be exposed through the upper surface of the mold layer.

The semiconductor package may include an RDL pattern on the upper surface of the mold layer. The RDL pattern may be electrically connected with the metal wire of the first and second vertical wire bonds and the conductive bump CB. The semiconductor package may include an external terminal electrically connected with the RDL pattern. The conductive bump CB may be used as the alignment key of the RDL pattern.

Alternatively, a semiconductor package may include a two-level type multi-stack structure, a mold layer, a first vertical wire and a conductive bump CB. The two-level type multi-stack structure may include first and second semiconductor chips stacked on the carrier substrate. The chip pads of the first and second semiconductor chips may be exposed. The mold layer may be configured to mold the two-level type multi-stack structure. The first vertical wire may include one and the other end. The one end may be connected to the chip pad of the first semiconductor chip. The other end may be vertically extended to be exposed through the upper surface of the mold layer. The conductive bump CB may be formed on the chip pad of the second semiconductor chip. The conductive bump CB may be exposed through the upper surface of the mold layer.

The semiconductor package may include an RDL pattern on the upper surface of the mold layer. The RDL pattern may be electrically connected with the first vertical wire and the conductive bump CB. The semiconductor package may include an external terminal electrically connected with the RDL pattern. The conductive bump CB may be used as the alignment key of the RDL pattern.

The above-described embodiments of the present disclosure are intended to illustrate and not to limit the present disclosure. Various alternatives and equivalents are possible. The present disclosure is not limited by the embodiments described herein. Nor is the present disclosure limited to any specific type of semiconductor device. Other additions, subtractions, and/or modifications are possible in view of the present disclosure and are intended to fall within the scope of the appended claims.

What is claimed is:

1. A method of manufacturing a semiconductor package, the method comprising:
    forming a multi-stack structure by stacking at least three semiconductor chips on a carrier substrate with an offset to expose chip pads of the semiconductor chips;
    forming a vertical wire bond by bonding one end of a metal wire to a chip pad of a semiconductor chip under the second-highest semiconductor chip in the multi-stack structure;
    forming a reverse wire bond by bonding one end of a reverse wire to a chip pad of the second-highest semiconductor chip and connecting the other end of the reverse wire to a conductive bump on a chip pad of the uppermost semiconductor chip in the multi-stack structure;
    molding the multi-stack structure with the vertical wire bond and the reverse wire bond using a mold layer; and
    processing the mold layer to expose the conductive bump, the other end of the metal wire in the vertical wire bond, and the other end of the reverse wire in the reverse wire bond through an upper surface of the mold layer.

2. The method of claim 1, wherein each of the at least three semiconductor chips comprise a memory chip of the same type.

3. The method of claim 1, wherein forming the multi-stack structure comprises:
    attaching a both-sided adhesive on lower surfaces of the at least three semiconductor chips; and
    stacking the at least three semiconductor chips on the carrier substrate,
    wherein the at least three semiconductor chips are stacked with an offset in one direction to expose the chip pads.

4. The method of claim 1, wherein forming the reverse wire bond comprises:
    forming a conductive bump on the chip pad of the uppermost semiconductor chip;
    forming a bonding ball on the one end of the reverse wire;
    bonding the bonding ball on the one end of the reverse wire to the chip pad of the second-highest semiconductor chip; and
    bonding the other end of the reverse wire to the conductive bump on the chip pad of the uppermost semiconductor chip.

5. The method of claim 1, wherein processing the mold layer comprises forming a redistribution layer (RDL) pattern on the upper surface of the multi-stack structure after exposing the conductive bump, the other end of the reverse wire in the reverse wire bond, and the other end of the metal wire in the vertical wire bond.

6. The method of claim 5, wherein forming the RDL pattern comprises:
    forming a photoresist film on the upper surface of the mold layer in the processed multi-stack structure;
    forming a photomask with an RDL pattern on the photoresist film using the conductive bump as an alignment key;
    irradiating the photomask with light to remove the photoresist film corresponding to an RDL pattern region, thereby forming RDL structures;
    plating a metal in a groove between the RDL structures; and
    removing the RDL structures to form the RDL pattern.

7. The method of claim 5, wherein forming the RDL pattern further comprises forming an external terminal on the RDL pattern.

8. A method of manufacturing a semiconductor package, the method comprising:
    forming a two-level type multi-stack structure by stacking first and second semiconductor chips on a carrier substrate with an offset to expose chip pads of the first and second semiconductor chips;
    forming a reverse wire bond by bonding one end of a reverse wire to a chip pad of the first semiconductor chip and the other end of the reverse wire to a conductive bump on a chip pad of the second semiconductor chip;
    molding the two-level type multi-stack structure using a mold layer; and
    processing the two-level type multi-stack structure to expose the conductive bump and the other end of the reverse wire in the reverse wire bond through an upper surface of the mold layer.

9. The method of claim 8, wherein processing the two-level type multi-stack structure comprises forming a redistribution layer (RDL) pattern on the upper surface of the mold layer after exposing the conductive bump and the other end of the reverse wire in the reverse wire bond.

10. The method of claim 9, wherein forming the RDL pattern comprises:
    forming a photoresist film on the upper surface of the mold layer in the processed two-level type multi-stack structure;
    forming a photomask with an RDL pattern on the photoresist film using the conductive bump as an alignment key;

irradiating the photomask with light to remove the photoresist film corresponding to an RDL pattern region, thereby forming RDL structures;

plating a metal in a groove between the RDL structures; and removing the RDL structures to form the RDL pattern.

11. The method of claim 9, wherein forming the RDL pattern further comprises forming an external terminal on the RDL pattern.

* * * * *